United States Patent
Saunders et al.

(10) Patent No.: US 6,825,780 B2
(45) Date of Patent: Nov. 30, 2004

(54) MULTIPLE CODEC-IMAGER SYSTEM AND METHOD

(75) Inventors: Steven E. Saunders, Cupertino, CA (US); William C. Lynch, Palo Alto, CA (US); Krasimir D. Kolarov, Menlo Park, CA (US)

(73) Assignee: Droplet Technology, Inc., Cupertino, CA (US)

( * ) Notice: Subject to any disclaimer, the term of this patent is extended or adjusted under 35 U.S.C. 154(b) by 0 days.

(21) Appl. No.: 10/418,831

(22) Filed: Apr. 17, 2003

(65) Prior Publication Data

US 2003/0197629 A1 Oct. 23, 2003

Related U.S. Application Data

(60) Provisional application No. 60/374,061, filed on Apr. 19, 2002, and provisional application No. 60/390,380, filed on Jun. 21, 2002.

(51) Int. Cl.[7] .............................................. H03M 7/00
(52) U.S. Cl. ...................................... 341/50; 341/51
(58) Field of Search ............................ 341/50, 51, 67; 382/240, 248; 375/240.11

(56) References Cited

U.S. PATENT DOCUMENTS

| | | | | |
|---|---|---|---|---|
| 5,619,197 A | * | 4/1997 | Nakamura .................... 341/50 |
| 5,694,346 A | * | 12/1997 | Milano et al. .............. 364/725 |
| 5,801,785 A | * | 9/1998 | Crump et al. ............... 348/563 |
| 5,893,145 A | | 4/1999 | Thayer et al. ............... 711/125 |
| 6,141,673 A | | 10/2000 | Thayer et al. .............. 708/402 |
| 6,144,773 A | | 11/2000 | Kolarov et al. ............. 382/240 |
| 6,148,110 A | | 11/2000 | Yajima et al. .............. 382/240 |
| 6,195,465 B1 | | 2/2001 | Zandi et al. ................ 382/248 |
| 6,229,929 B1 | | 5/2001 | Lynch et al. ............... 382/268 |
| 6,272,180 B1 | | 8/2001 | Lei ........................ 375/240.16 |
| 6,309,424 B1 | * | 10/2001 | Fallon .......................... 341/51 |
| 6,332,043 B1 | | 12/2001 | Ogata ........................ 382/240 |
| 6,360,021 B1 | | 3/2002 | McCarthy et al. .......... 382/254 |
| 6,381,280 B1 | | 4/2002 | Lynch et al. ........... 375/240.19 |
| 6,396,948 B1 | | 5/2002 | Lynch et al. ................ 382/166 |
| 6,407,747 B1 | | 6/2002 | Chui et al. .................. 345/660 |
| 6,516,030 B1 | | 2/2003 | Lynch et al. ........... 375/240.11 |
| 6,556,725 B1 | * | 4/2003 | Kondo et al. ............... 382/305 |
| 6,624,761 B2 | * | 9/2003 | Fallon .......................... 341/51 |
| 6,667,698 B2 | * | 12/2003 | Apostolopoulos et al. .... 341/51 |
| 2002/0137059 A1 | * | 9/2002 | Wu et al. ...................... 435/6 |

OTHER PUBLICATIONS

Kolarov et al., "Video Compression for the Portable and Wireless Markets," Dec. 2002, Droplet Technology, Inc., White Paper.

D. LeGall and A. Tabatabai, "Sub-band coding digital images using symmetric short kernel filters and arithmetic coding techniques", IEEE International Conference on Acoustics, Speech and Signal Processing, New York, NY, pp. 761–765, 1988.

ISO/IEC 15444–1 JPEG 2000 image coding system—Part 1: Core coding system, Mar. 2000.

(List continued on next page.)

*Primary Examiner*—Brian Young
*Assistant Examiner*—Joseph Lauture
(74) *Attorney, Agent, or Firm*—Zilka-Kotab, PC; Kevin J. Zilka

(57) ABSTRACT

A system and method are provided for compressing data utilizing multiple encoders on a single integrated circuit. Initially, data is received in a single integrated circuit. The data is then encoded utilizing a plurality of encoders incorporated on the single integrated circuit. Another single module system and method are provided for compressing data. In use, photons are received utilizing a single module. Thereafter, compressed data representative of the photons is outputted utilizing the single module.

21 Claims, 5 Drawing Sheets

OTHER PUBLICATIONS

R. Crochiere and L. Rabiner, Multirate Digital Signal Processing, Prentice Hall 1983.

ISO/IEC JTC 1/SC 29/WG 1 N1646 Coding of Still Pictures, Mar. 16, 2000.

ISO/IEC 11172–2:1993 Coding of moving pictures and audio at up to 1,5 Mbit/s—Part 2: Video.

ISO/IEC 10918–1 Digital compression and coding of continuous–tone still images: Requirements and guidelines, 1992.

ISO/IEC 13818–2:1995 Coding of moving pictures and associated audio: Part 2. Video.

ISO/IEC 14496–2 MPEG–4 Part 2: Visual, Apr. 1999.

* cited by examiner

MULTIPLE CODEC-IMAGER SYSTEM AND METHOD

RELATED APPLICATION(S)

The present application claims priority from a first provisional application filed Apr. 19, 2002 under Ser. No. 60/374,061, and a second provisional application filed Jun. 21, 2002 under Ser. No. 60/390,380, which are each incorporated herein by reference in their entirety.

FIELD OF THE INVENTION

The present invention relates to data compression, and more particularly to compressing data utilizing wavelets.

BACKGROUND OF THE INVENTION

Video "codecs" (compressor/decompressor) are used to reduce the data rate required for data communication streams by balancing between image quality, processor requirements (i.e. cost/power consumption), and compression ratio (i.e. resulting data rate). The currently available compression approaches offer a different range of trade-offs, and spawn a plurality of codec profiles, where each profile is optimized to meet the needs of a particular application.

2D and 3D wavelets are current alternatives to the DCT-based codec algorithms carried out by MPEG video distribution profiles. Wavelets have been highly regarded due to their pleasing image quality and flexible compression ratios, prompting the JPEG committee to adopt a wavelet algorithm for its JPEG2000 still image standard. Unfortunately, most wavelet implementations use very complex algorithms, requiring a great deal of processing power, relative to DCT alternatives. In addition, wavelets present unique challenges for temporal compression, making 3D wavelets particularly difficult.

For these reasons, wavelets have never offered a cost-competitive advantage over high volume industry standard codecs like MPEG, and have therefore only been adopted for niche applications. There is thus a need for a commercially viable implementation of 3D wavelets that is optimized for low power and low cost.

Digital image compression and digital video compression are commercially important processes that can be performed either by a program running on a general-purpose computer processor (including a DSP: digital signal processor), or by dedicated hardware such as an ASIC: Application Specific Integrated Circuit.

Digital video compression methods implemented in dedicated hardware are commercially available (from Sony and others). However, the standard compression methods MPEG-1, MPEG-2, MPEG-4, JPEG, Motion-JPEG, and JPEG-2000 have thus far required so much dedicated circuitry that it has been found practical to implement only one compression or decompression process in a single ASIC.

DISCLOSURE OF THE INVENTION

A system and method are provided for compressing data utilizing multiple encoders on a single integrated circuit. Initially, data is received in a single integrated circuit. The data is then encoded utilizing a plurality of encoders incorporated on the single integrated circuit.

In one embodiment, data may be encoded utilizing multiple channels on the single integrated circuit. Moreover, the data may be encoded into a wavelet-based format.

Another single module system and method are provided for compressing data. In use, photons are received utilizing a single module. Thereafter, compressed data representative of the photons is outputted utilizing the single module.

As an option, the compressed data may be encoded into a wavelet-based format. Moreover, the transform operations associated with the encoding may be carried out in analog. The single module may further include an imager.

DESCRIPTION OF THE PREFERRED EMBODIMENTS

Figure 1:
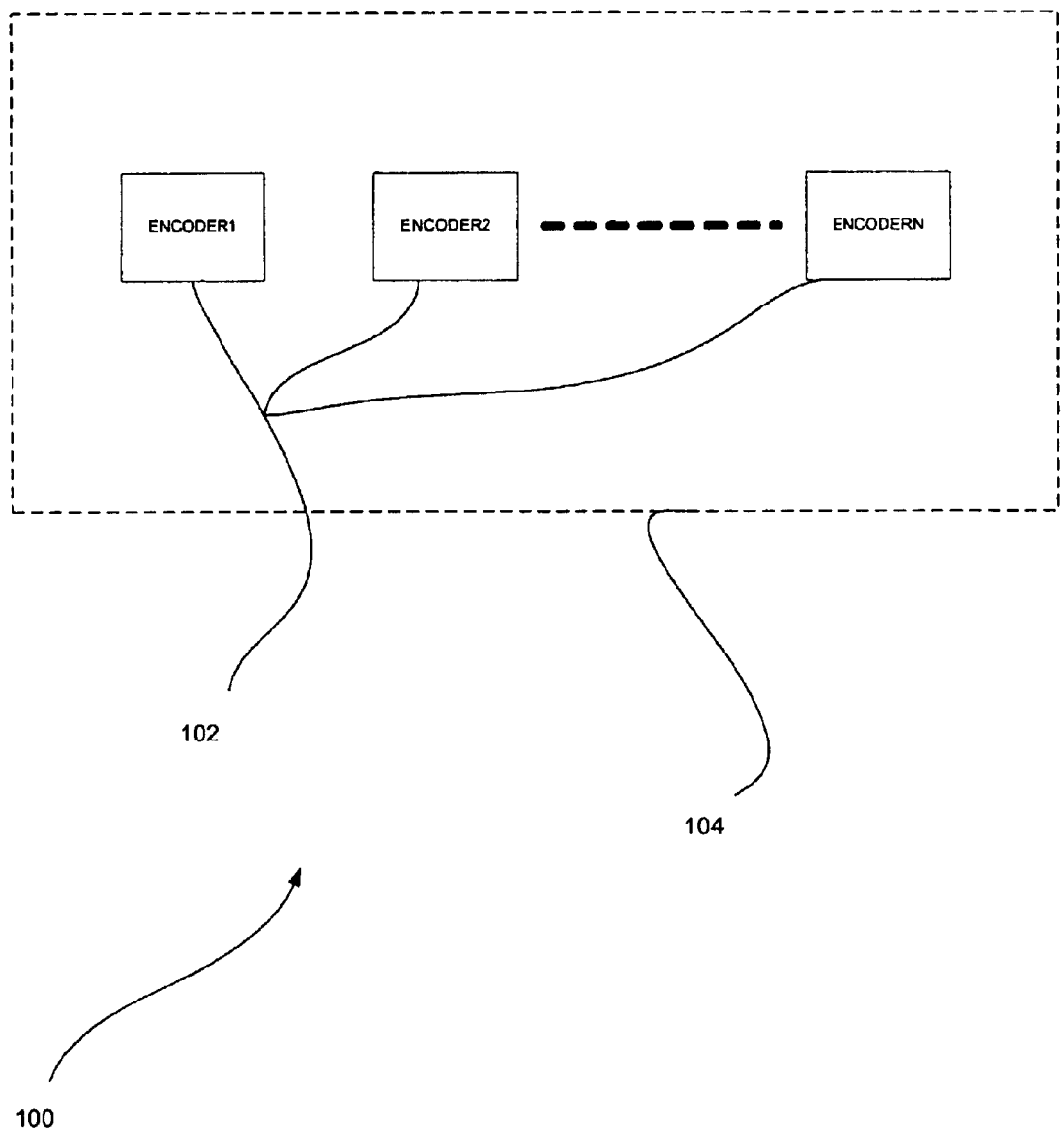
FIG. 1 illustrates a system for compressing data utilizing multiple encoders on a single integrated circuit.

FIG. 1 illustrates a system 100 for compressing data utilizing multiple encoders 102 on a single integrated circuit 104 (i.e. ASIC). As shown, a first encoder is embodied on the single integrated circuit 104 for encoding a first set of data. Moreover, a second encoder is embodied on the same single integrated circuit 104 as the first encoder for encoding a second set of data. Of course, more encoders may be embodied on the single integrated circuit 104 for similar purposes.

In use, data is received in the single integrated circuit. The data is then encoded utilizing a plurality of encoders incorporated on the single integrated circuit.

In one embodiment, data may be encoded utilizing multiple channels on the single integrated circuit. Moreover, the data may be encoded into a wavelet-based format.

Many applications for video compression would be better served by an ASIC containing multiple coding or decoding stages. An example is the category of Personal Video Recorders (PVR) or Digital Video Recorders (DVR), such as the products of TiVo and Replay TV, wherein the processes of compression and decompression must be performed simultaneously. Another example is video surveillance recorders, wherein many video signals from cameras must be multiplexed, compressed, and recorded together.

Putting several compression circuits on a single ASIC, or a combination of compression and decompression circuits on a single ASIC, offers both direct and indirect advantages. Direct advantages include reduced package count, reduced pin count, reduced power consumption, and reduced circuit board area. All of these contribute to reduced product cost.

Indirect advantages include the possibility to incorporate video selection and multiplexing circuitry on the same chip, further reducing the pin count and board area.

There are now video compression methods, for example the algorithms described during reference to FIGS. 2-5 developed by Droplet Technology, Inc.(R), that require far less circuitry to implement than the conventional and standard compression methods. Due to their superior design, multiple instances of these advanced compression methods may now be integrated onto a single ASIC or other integrated circuit.

Another single module system and method for compressing data are further provided. In use, photons are received utilizing a single module. Thereafter, compressed data representative of the photons is outputted utilizing the single module.

As an option, the compressed data may be encoded into a wavelet-based format. Moreover, the transform operations associated with the encoding may be carried out in analog. The single module may further include an imager.

The present embodiment may be implemented for building imager arrays—CMOS or CCD cameras or other devices—to facilitate the whole process of capturing and delivering compressed digital video.

Directly digitized images and video take lots of bits; it is common to compress images and video for storage, transmission, and other uses. Several basic methods of compression are known, and very many specific variants of these. A general method can be characterized by a three-stage process: transform, quantize, and entropy-code.

The intent of the transform stage in a video compressor is to gather the energy or information of the source picture into as compact a form as possible by taking advantage of local similarities and patterns in the picture or sequence. The present embodiment works well on "typical" inputs and ignores their failure to compress "random" or "pathological" inputs.

Many image compression and video compression methods, such as JPEG [1], MPEG-2 [2] and MPEG-4 [4], use the discrete cosine transform (DCT) as the transform stage.

Some newer image compression and video compression methods, such as JPEG-2000 [3] and MPEG-4 textures [4], use various wavelet transforms as the transform stage.

A wavelet transform comprises the repeated application of wavelet filter pairs to a set of data, either in one dimension or in more than one. For image compression, one may use a 2-D wavelet transform (horizontal and vertical); for video one may use a 3-D wavelet transform (horizontal, vertical, and temporal).

A wavelet filter pair processes an image (or a section of an image) to produce two images, each typically half the size of the input, that can generally be regarded as "low-pass" or average or blurred, for one, and "high-pass" or detail or edges, for the other. The full information in the input picture is retained, and the original can be reconstructed exactly (in many cases), from the transformed image pair. A wavelet filter pair generally processes an image in one dimension, either horizontally, vertically, or temporally (across a time sequence of frames). The full wavelet transform is composed of a series of these steps applied in several dimensions successively. In general, not all of the results of earlier steps are subjected to later steps; the high-pass image is sometimes kept without further filtering.

A camera has at its heart an imager device: something that responds to and records varying intensities and colors of light for later display and other uses. Common imager devices for digital still cameras and video cameras today are CCDs and CMOS arrays. Both accumulate an electric charge in response to light at each pixel; they differ in the way they transfer and read out the amount of charge.

CMOS ("complimentary metal-oxide semiconductor") imagers are the newer technology, and can be made less expensively than CCDs. A key advantage of CMOS imagers is that the processing of the imager chip resembles the processing of digital logic chips rather closely. This makes it easier to include control and other functions on the same chip. Both kinds of chip, however, are necessarily built from analog circuits at the lowest level to measure the analog charge or voltage or current that represents the amount of light seen.

CMOS imagers are very similar in structure to DRAMs ("dynamic random-access memories"), and transfer the charge that represents the light seen in a pixel to the edge of the array along a grid of metal traces that cross the array. This readout method is standard practice for memory chips and is well developed in the industry.

CCD imagers, while an older technology, are well developed and offer lower noise and better sensitivity. CCDs ("charge-coupled devices") transfer the charge that represents the light seen in a pixel to the edge of the array by passing it from cell to cell in bucket-brigade fashion.

A CMOS imager or CCD imager differs from a digital memory device in that the charge transferred to the edge of the array represents not just a "0" or "1" bit value, but a range of brightness values. Thus an analog-to-digital conversion is required. Preceding this conversion, the signal is amplified; it is often subjected to other processing to cancel out errors and variability in the chip fabrication and operation. A common processing step is "correlated double sampling", in which a dark sample is taken and stored as a measure of the leakage current for this part of the circuit, and subtracted from the image sample to reduce noise patterns.

The analog processing is done in a differential amplifier, a circuit that responds primarily to the difference between its inputs rather than to the absolute size of either one.

At some point in the processing chain between light capture and stored digital images, the signal must be converted from analog (charge, voltage, or current) representation to digital representation.

Because one can choose to do the analog-to-digital sooner or later in the chain, he or she has the option of doing some stages of the overall processing either in analog or in digital form.

The wavelet filter pair that is a step of a wavelet consists, in some implementations, of a very simple set of additions and subtractions of adjacent and nearby pixel values. For instance, useful filter pair, called the "Haar Wavelet", is just the sum and difference as follows in Equations #1.1, and 1.2.

Equations #1.1, and 1.2.

$$L_n = X_{2n} + X_{2n+1} \quad \text{eq 1.1}$$

$$H_n = X_{2n} - X_{2n+1} \quad \text{eq 1.2}$$

This generates one sample of the "High" transformed image and one sample of the "Low" transformed image from the same two samples of the input image "X".

Other wavelet filters are possible and are used; some are very complex, but some are as simple as doing a few Haar steps, summing them together, and scaling them by constant amounts.

For instance, one of the transforms specified in the JPEG 2000 standard [1] is the reversible 5-3 transform. See Equations #1.1J, and 1.2J.

Equations #1.1J, and 1.2J $$Y_{2n+1} = X_{2n+1} - \left\lfloor \frac{X_{2n} + X_{2n+2}}{2} \right\rfloor \quad \text{eq 1.1J}$$

-continued $$Y_{2n} = X_{2n} + \left\lfloor \frac{Y_{2n-1} + Y_{2n+1} + 2}{4} \right\rfloor \quad \text{eq 1.2J}$$

As one can see, the entire wavelet filter pair takes 5 add/subtract operations and two scaling operations; in the continuous analog domain the floor operations disappear.

It turns out that summing analog values together is easily and naturally accomplished by differential amplifiers (for either addition or subtraction), and that scaling by a constant amount is the easiest operation of all for an analog signal, requiring only a resistor or two.

In contrast, summing values in the digital domain requires an adder logic circuit for each bit plus a carry chain; scaling by some special constant amounts is easy but general scaling is not cheap in digital logic.

Because CMOS and CCD imagers are presently built using differential amplifiers to amplify and subtract noise from the pixel samples on the chip, it is fairly easy to do some simple processing steps on the chip before digital-to-analog conversion. Doing these steps adds some analog circuitry to the chip, but it can be a small amount of circuitry.

It turns out in some implementations of the wavelet transform, including those one prefers, that the first step computed is the most expensive. This is because each of the first several steps reduces the amount of image to be processed by later stages; one does not necessarily further process the "high pass" image output by each filter stage. Thus implementing the first step or first few steps in analog, before doing analog-to-digital conversion, can reduce the digital processing significantly, since only the "low pass" image must be digitally processed. The benefit can be taken either by reducing the amount of digital circuitry, thus reducing the chip area it occupies, or by running the digital circuitry slower, thus reducing its power consumption and heat generation.

The transform stage of image or video compression can be done using a DCT; this process transforms an image into a spectrum, whose successive samples represent the content of a range of spatial frequencies in the image. Some implementations of DCT use Haar steps, and these could benefit from being done in analog as well.

Usually in wavelet transforms, one can compute a horizontal filter pair as the first step. This seems convenient for the analog filtering as well. One can do two horizontal steps before doing the first vertical filter step, and this would also be convenient in analog.

Vertical filter steps require the simultaneous presence of vertically adjacent pixels. In the conventional image scanning raster order, such pixels appear widely separated in time (a line time apart). However, in chip imagers such as CMOS imagers, it is reasonable to consider rearranging the scan order so that several lines appear together, and then it is feasible to do a vertical filter step in analog as well, either before or after the first horizontal filter step.

Imager chips that capture color images typically place a color filter in front of each pixel, restricting it to one of red, green, or blue response. These filters are arranged in a pattern so that all three colors are sampled adjacently everywhere in the image.

Digital video standards, however, prefer an arrangement of components other than RGB. The most widely used is YUV, or $YC_bC_r$, in which the Y component represents black-and-white brightness or "luma" and the U and V components represent color differences between blue or red and luma. The reason for this representation is that human visual response allows lower resolution in the C components, thus allowing smaller digital representations of images. The YUV representation is convenient for compression as well. Color imager chips sometimes provide circuitry to do the operation of transforming RGB pixel values into YUV values, either analog (before conversion) or digital (after conversion).

One can combine color conversion with wavelet filter steps in any of several ways. For instance, the analog color conversion can precede the first analog wavelet filter step; in this case the wavelet filters work on full-bandwidth Y component and on half-bandwidth U and V components. Alternatively, the wavelet filters can be applied to the R, G, and B components from the imager array first, followed by color conversion to YUV; in this case the filters work on three full-bandwidth component signals.

In another arrangement, one can omit the conventional color conversion step altogether and provide RGB components to the wavelet transform. There are versions of the wavelet transform that accomplish conversion to YUV as part of their operation. In this arrangement, the analog circuitry that does the color conversion is replaced by the analog circuitry that does the first wavelet steps, for no net increase in analog circuitry, reduced digital circuitry, and a very clean interface with the digital wavelet compression processing.

It has thus been shown how to make a compressed digital video capture subsystem more efficient by incorporating analog computation of the initial wavelet filter step or steps. This can be done for monochrome imagers, and can be combined in several ways with the color conversion stage of color digital imagers. This method improves the performance and computational efficiency of wavelet-based image compression and video compression products.

More information regarding an optional framework 200 in which the present embodiment may be implemented will now be set forth.

Figure 2:
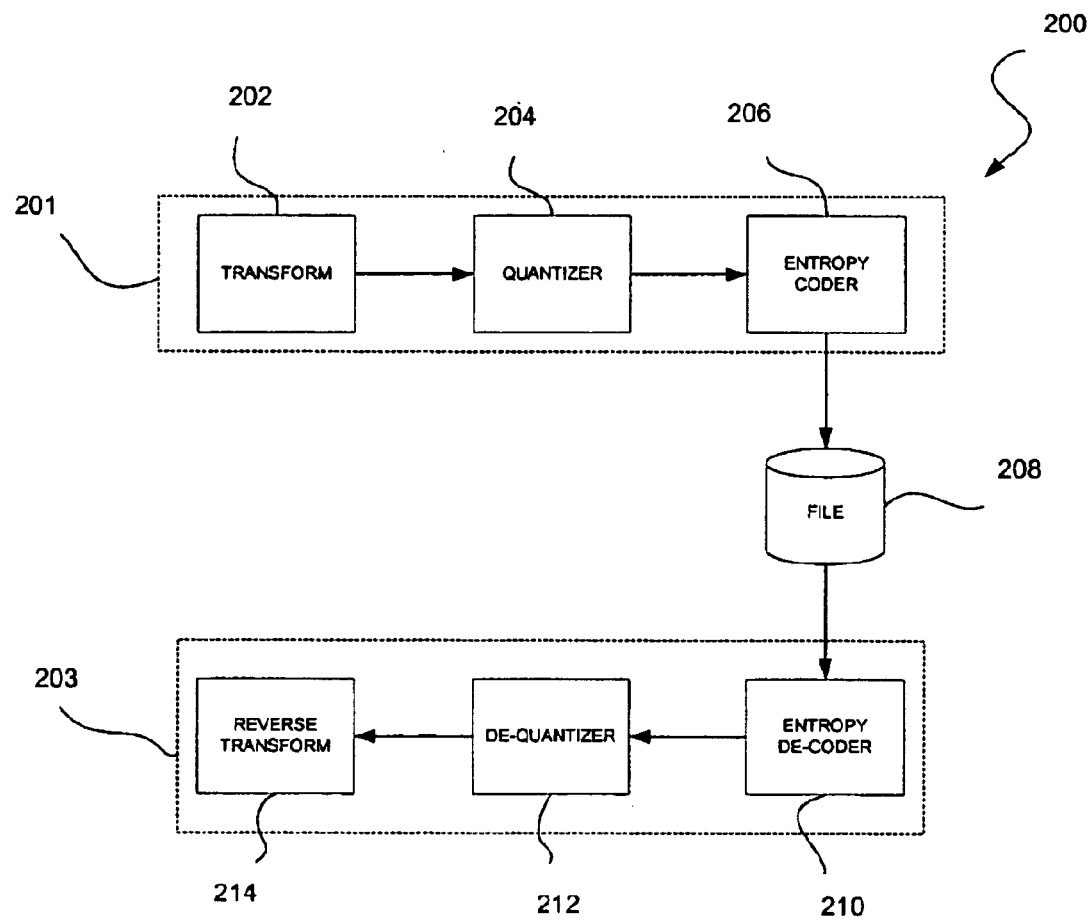
FIG. 2 illustrates a framework for compressing/decompressing data, in accordance with one embodiment.

FIG. 2 illustrates a framework 200 for compressing/decompressing data, in accordance with one embodiment. Included in this framework 200 are a coder portion 201 and a decoder portion 203, which together form a "codec." The coder portion 201 includes a transform module 202, a quantizer 204, and an entropy encoder 206 for compressing data for storage in a file 208. To carry out decompression of such file 208, the decoder portion 203 includes a reverse transform module 214, a de-quantizer 212, and an entropy decoder 210 for decompressing data for use (i.e. viewing in the case of video data, etc).

In use, the transform module 202 carries out a reversible transform, often linear, of a plurality of pixels (in the case of video data) for the purpose of de-correlation. Next, the quantizer 204 effects the quantization of the transform values, after which the entropy encoder 206 is responsible for entropy coding of the quantized transform coefficients.

Figure 3:
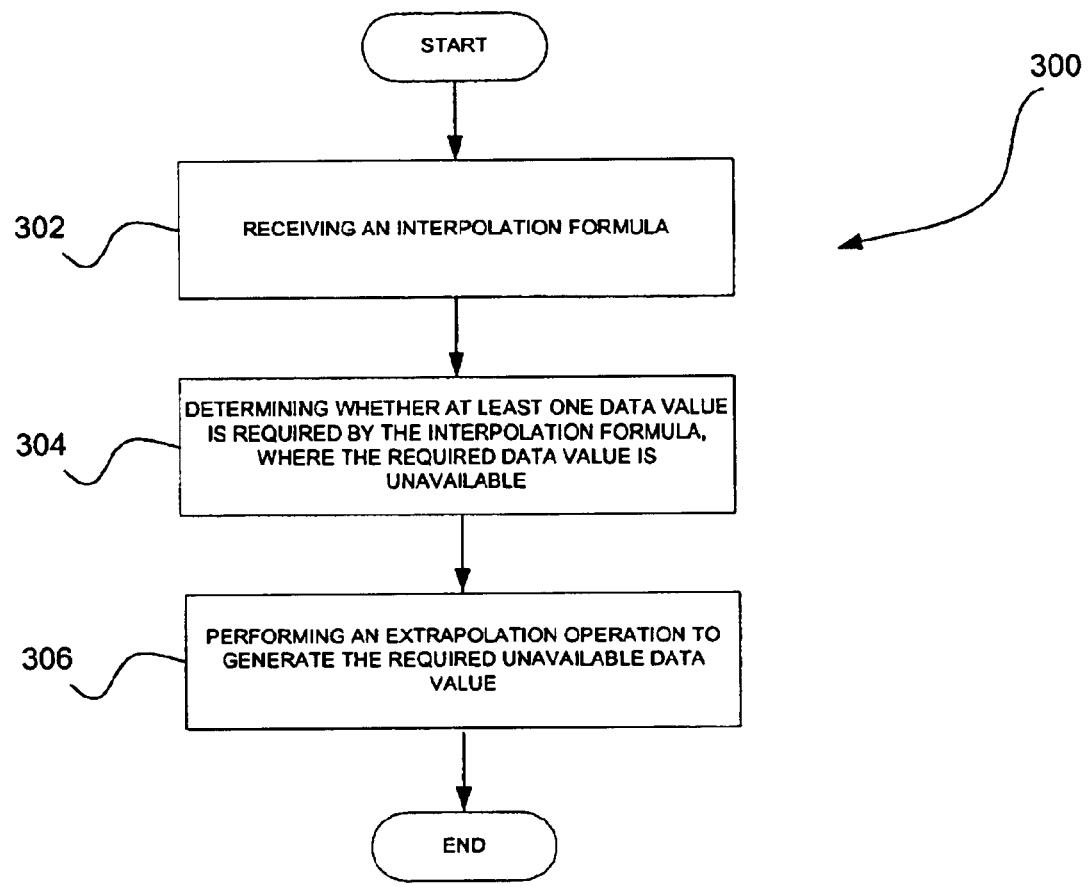
FIG. 3 illustrates a method for compressing/decompressing data, in accordance with one embodiment.

FIG. 3 illustrates a method 300 for compressing/decompressing data, in accordance with one embodiment. In one embodiment, the present method 300 may be carried out in the context of the transform module 202 of FIG. 2 and the manner in which it carries out a reversible transform. It should be noted, however, that the method 300 may be implemented in any desired context.

In operation 302, an interpolation formula is received (i.e. identified, retrieved from memory, etc.) for compressing data. In the context of the present description, the data may refer to any data capable of being compressed. Moreover, the interpolation formula may include any formula employing interpolation (i.e. a wavelet filter, etc.).

In operation 304, it is determined whether at least one data value is required by the interpolation formula, where the required data value is unavailable. Such data value may include any subset of the aforementioned data. By being unavailable, the required data value may be non-existent, out of range, etc.

Thereafter, an extrapolation operation is performed to generate the required unavailable data value. See operation 306. The extrapolation formula may include any formula employing extrapolation. By this scheme, the compression of the data is enhanced.

Figure 4:
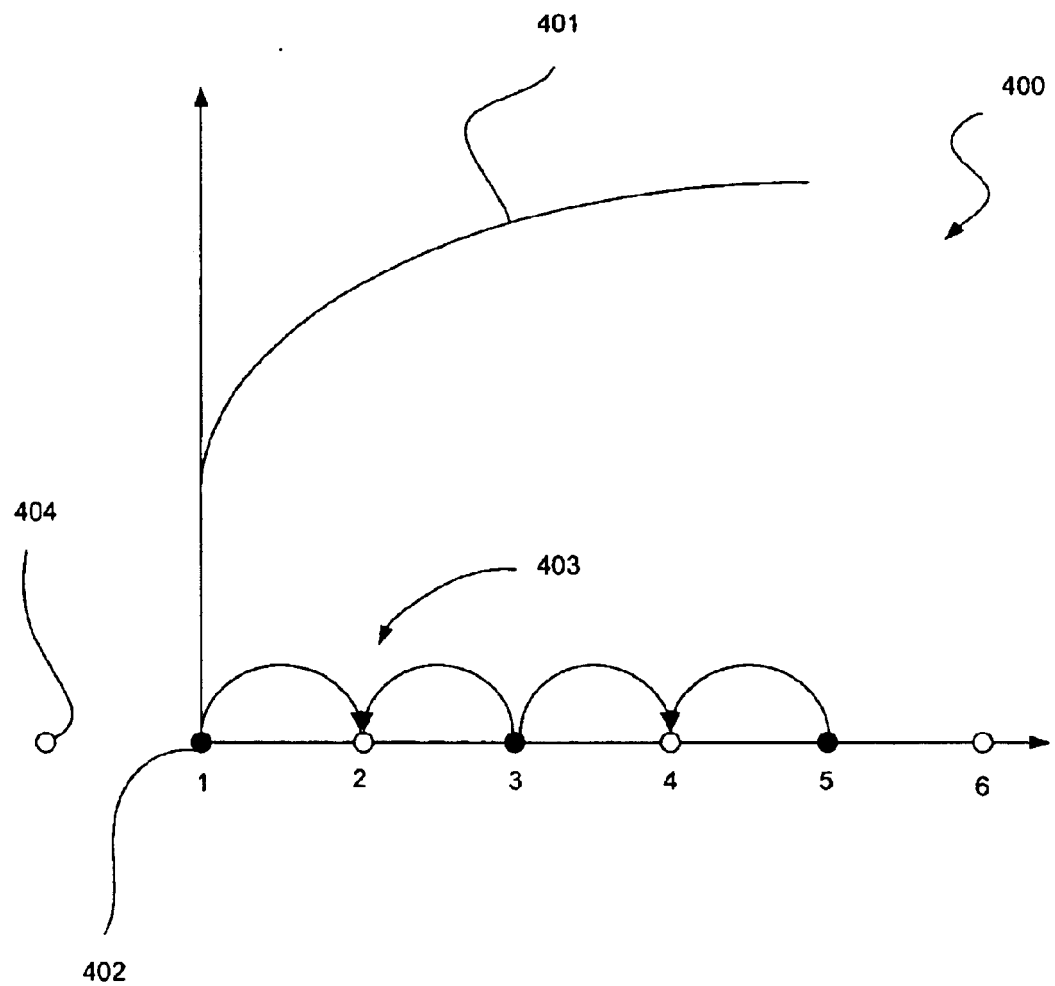
FIG. 4 shows a data structure on which the method of FIG. 3 is carried out.

FIG. 4 shows a data structure 400 on which the method 300 is carried out. As shown, during the transformation, a "best fit" 401 may be achieved by an interpolation formula 403 involving a plurality of data values 402. Note operation 302 of the method 300 of FIG. 3. If it is determined that one of the data values 402 is unavailable (see 404), an extrapolation formula may be used to generate such unavailable data value. More optional details regarding one exemplary implementation of the foregoing technique will be set forth in greater detail during reference to FIG. 5.

Figure 5:
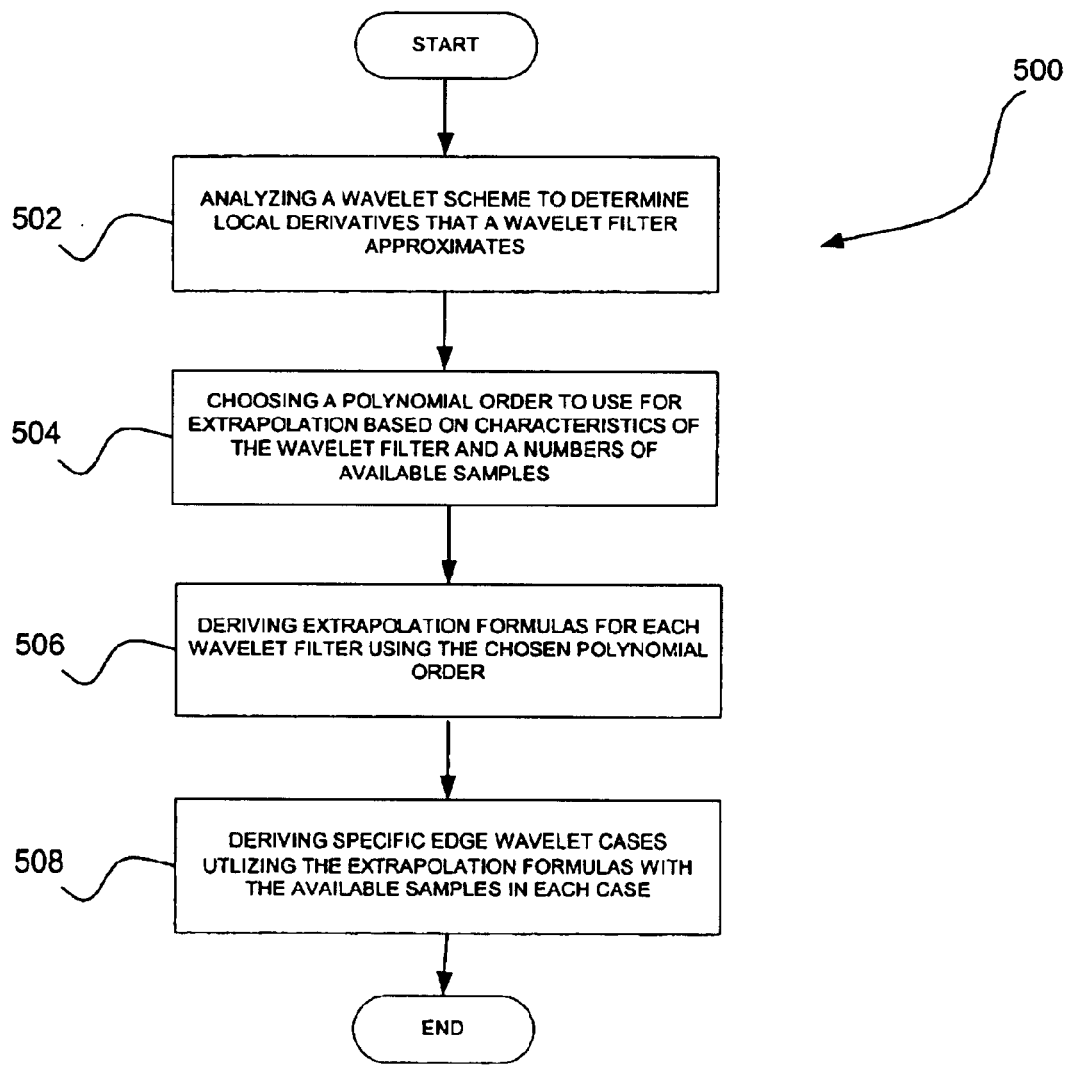
FIG. 5 illustrates a method for compressing/decompressing data, in accordance with one embodiment.

FIG. 5 illustrates a method 500 for compressing/decompressing data, in accordance with one embodiment. As an option, the present method 500 may be carried out in the context of the transform module 202 of FIG. 2 and the manner in which it carries out a reversible transform. It should be noted, however, that the method 500 may be implemented in any desired context.

The method 500 provides a technique for generating edge filters for a wavelet filter pair. Initally, in operation 502, a wavelet scheme is analyzed to determine local derivatives that a wavelet filter approximates. Next, in operation 504, a polynomial order is chosen to use for extrapolation based on characteristics of the wavelet filter and a numbers of available samples. Next, extrapolation formulas are derived for each wavelet filter using the chosen polynomial order. See operation 506. Still yet, in operation 508, specific edge wavelet cases are derived utlizing the extrapolation formulas with the available samples in each case.

See Appendix A for an optional method of using Vandermonde type matrices to solve for the coefficients. Moreover, additional optional information regarding exemplary extrapolation formulas and related information will now be set forth in greater detail.

To approximate $Y_{2N-1}$ from the left, one may fit a quadratic polynomial from the left. Approximating the negative of half the 2nd derivative at 2N−1 using the available values yields Equation # 1.1.R. See Appendix A for one possible determination of this extrapolating quadratic.

Equation #1.1.R $$Y_{2N-1} = -\frac{1}{3}\left(X_{2N-1} - \left\lfloor \frac{3X_{2N-2} - X_{2N-4} + 1}{2} \right\rfloor\right) \qquad \text{eq 1.1.R}$$

Equation # 1.1.R may be used in place of Equation #1.1 J when point one is right-most. The apparent multiply by 3 can be accomplished with a shift and add. The division by 3 is trickier. For this case where the right-most index is 2N−1, there is no problem calculating Y2N-2 by means of Equation #1.2J. In the case where the index of the right-most point is even (say 2N), there is no problem with Equation #1.1J, but Equation #1.2J involves missing values. Here the object is to subtact an estimate of Y from the even X using just the previously calculated odd indexed Y s, $Y_1$ and $Y_3$ in the case in point. This required estimate at index 2N can be obtained by linear extrapolation, as noted above. The appropriate formula is given by Equation #1.2.R.

Equation #1.2.R $$Y_{2N} = X_{2N} + \left\lfloor \frac{3Y_{2N-1} - Y_{2N-3} + 2}{4} \right\rfloor \qquad \text{eq 1.2.R}$$

A corresponding situation applies at the left boundary. Similar edge filters apply with the required extrapolations from the right (interior) rather than from the left. In this case, the appropriate filters are represented by Equations #1.1.L and 1.2.L.

$$Y_0 = -\frac{1}{3}\left(X_0 - \left\lfloor \frac{3X_1 - X_3 + 1}{2} \right\rfloor\right) \qquad \text{eq 1.1.L}$$

$$Y_0 = X_0 + \left\lfloor \frac{3Y_1 - Y_3 + 2}{4} \right\rfloor \qquad \text{eq 1.2.L}$$

The reverse transform fiters can be obtained for these extrapolating boundary filters as for the original ones, namely by back substitution. The inverse transform boundary filters may be used in place of the standard filters in exactly the same circumstances as the forward boundary filters are used. Such filters are represented by Equations #2.1.Rinv, 2.2.Rinv, 2.1.L.inv, and 2.2.L.inv.

Equations #2.1.Rinv, 2.2.Rinv, 2.1.L.inv, 2.2.Linv $$X_{2N-1} = -3Y_{2N-1} + \left\lfloor \frac{3X_{2N-2} - X_{2N-4} + 1}{2} \right\rfloor \qquad \text{eq 2.1.R inv}$$

$$X_{2N} = Y_{2N} - \left\lfloor \frac{3Y_{2N-1} - Y_{2N-3} + 2}{4} \right\rfloor \qquad \text{eq 2.2.R inv}$$

$$X_0 = -3Y_0 + \left\lfloor \frac{3X_1 - X_3 + 1}{2} \right\rfloor \qquad \text{eq 2.1.L inv}$$

$$X_0 = Y_0 - \left\lfloor \frac{3Y_1 - Y_3 + 2}{4} \right\rfloor \qquad \text{eq 2.2.L inv}$$

Thus, one embodiment may utilize a reformulation of the 5-3 filters that avoids the addition steps of the prior art while preserving the visual properties of the filter. See for example, Equations #3.1, 3.1 R, 3.2, 3.2L.

Equations #3.1, 3.1R, 3.2, 3.2L $$Y_{2n+1} = (X_{2n+1} + 1/2) - \left\lfloor \frac{(X_{2n} + 1/2) + (X_{2n+2} + 1/2)}{2} \right\rfloor \qquad \text{eq 3.1}$$

$$Y_{2N+1} = (X_{2N+1} + \tfrac{1}{2}) - (X_{2N} + \tfrac{1}{2}) \qquad \text{eq 3.1R}$$

$$(Y_{2n} + 1/2) = (X_{2n} + 1/2) + \left\lfloor \frac{Y_{2n-1} + Y_{2n+1}}{4} \right\rfloor \qquad \text{eq 3.2}$$

$$(Y_0 + 1/2) = (X_0 + 1/2) + \left\lfloor \frac{Y_1}{2} \right\rfloor \qquad \text{eq 3.2L}$$

In such formulation, certain coefficients are computed with an offset or bias of ½, in order to avoid the additions mentioned above. It is to be noted that, although there appear to be many additions of ½ in this formulation, these additions need not actually occur in the computation. In Equations #3.1 and 3.1 R, it can be seen that the effects of the additions of ½ cancel out, so they need not be applied to the input data. Instead, the terms in parentheses ($Y_0+½$) and the like may be understood as names for the quantities actually calculated and stored as coefficients, passed to the following level of the wavelet transform pyramid.

Just as in the forward case, the JPEG-2000 inverse filters can be reformulated in the following Equations #4.2, 4.2L, 4.1, 4.1R.

Equations #4.2, 4.2L, 4.1, 4.1R $$(X_{2n}+1/2) = (Y_{2n}+1/2) - \left\lfloor \frac{Y_{2n-1}+Y_{2n+1}}{4} \right\rfloor \quad \text{eq 4.2}$$

$$(X_0+1/2) = (Y_0+1/2) - \left\lfloor \frac{Y_1}{2} \right\rfloor \quad \text{eq 4.2L}$$

$$(X_{2n+1}+1/2) = Y_{2n+1} + \left\lfloor \frac{(X_{2n}+1/2)+(X_{2n+2}+1/2)}{2} \right\rfloor \quad \text{eq 4.1}$$

$$(X_{2N+1}+½) = Y_{2N+1} + (X_{2N}+½) \quad \text{eq 4.1R}$$

As can be seen here, the values taken as input to the inverse computation are the same terms produced by the forward computation in Equations #3.1~3.2L and the corrections by ½ need never be calculated explicitly.

In this way, the total number of arithmetic operations performed during the computation of the wavelet transform is reduced.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Appendix A

One may have three data values, $$[X_{2N-1} \quad X_{2N-2} \quad X_{2N-4}],$$

and need three coefficients for the quadratic:

$$[a_0 \quad a_1 \quad a_2] \begin{bmatrix} x^0 \\ x^1 \\ x^2 \end{bmatrix} = a_0 + a_1 x + a_2 x^2.$$

the negative of half the $2^{nd}$ derivative may be $$-\frac{1}{2}2a_2$$

so interest may only be in $a_2$. In that case, it is more simple to find the quadratic:

$$[\tilde{a}_0 \quad \tilde{a}_1 \quad \tilde{a}_2] \begin{bmatrix} (x-2N)^0 \\ (x-2N)^1 \\ (x-2N)^2 \end{bmatrix} = \tilde{a}_0 + \tilde{a}_1(x-2N) + \tilde{a}_2(x-2N)^2$$

since $$a_2 = \tilde{a}_2$$

Three linear equations with a Vandermonde type coefficient matrix may be solved.

$$[\tilde{a}_0 \quad \tilde{a}_1 \quad \tilde{a}_2] \begin{bmatrix} (-1)^0 & (-2)^0 & (-4)^0 \\ (-1)^1 & (-2)^1 & (-4)^1 \\ (-1)^2 & (-2)^2 & (-4)^2 \end{bmatrix} = [X_{2N-1} \quad X_{2N-2} \quad X_{2N-4}]$$

$$[\tilde{a}_0 \quad \tilde{a}_1 \quad \tilde{a}_2] = [X_{2N-1} \quad X_{2N-2} \quad X_{2N-4}] \frac{1}{6} \begin{bmatrix} 16 & 12 & 2 \\ -12 & -15 & -3 \\ 2 & 3 & 1 \end{bmatrix}$$

Half of the negative of the $2^{nd}$ derivative is:

$$-\frac{1}{2}2a_2 = -\frac{1}{2}2\tilde{a}_2$$

$$= -\frac{1}{6}[X_{2N-1} \quad X_{2N-2} \quad X_{2N-4}] \begin{bmatrix} 2 \\ -3 \\ 1 \end{bmatrix}$$

$$= -\frac{2}{6}X_{2N-1} + \frac{3}{6}X_{2N-2} - \frac{1}{6}X_{2N-4}$$

What is claimed is:

1. A method for compressing data utilizing multiple encoders on a single integrated circuit, comprising:
   receiving data in a single integrated circuit including circuitry;
   electronically encoding the data utilizing a plurality of encoders incorporated on the single integrated circuit;
   wherein the data is compressed utilizing the encoders.

2. The method as recited in claim 1, wherein the data is encoded utilizing multiple channels on the single integrated circuit.

3. The method as recited in claim 1, wherein the data is encoded into a wavelet-based format.

4. The method as recited in claim 3, wherein the compression includes: receiving an interpolation formula; determining whether at least one data value is required by the interpolation formula, where the required data value is unavailable; and performing an extrapolation operation to generate the required unavailable data value; wherein the interpolation formula is utilized for compressing the data.

5. The method as recited in claim 1, wherein the data represents an image.

6. The method as recited in claim 1, wherein the data represents video.

7. The method as recited in claim 1, wherein the data includes video.

8. The method as recited in claim 1, wherein the data includes video data which is encoded utilizing multiple video encoders on the single integrated circuit.

9. A single integrated circuit for compressing data, comprising:
   a first encoder embodied on the single integrated circuit including circuitry for electronically encoding a first Set of data; and a second encoder embodied on the same single integrated circuit as the first encoder for electronically encoding a second set of data;

wherein the data is compressed utilizing the encoders.

10. The single integrated circuit as recited in claim 9, wherein the data is encoded utilizing multiple channels on the single integrated circuit.

11. The single integrated circuit as recited in claim 9, wherein the data is encoded into a wavelet-based format.

12. The single integrated circuit as recited in claim 9, wherein the data represents an image.

13. The single integrated circuit as recited in claim 9, wherein the data represents video.

14. The single integrated circuit as recited in claim 9, wherein the data includes video.

15. A method for compressing data utilizing a single module, comprising:

receiving photons utilizing a single module including circuitry; and outputting electronically compressed data representative of the photons utilizing the single module;

wherein the data is compressed utilizing at least one encoder.

16. The method as recited in claim 15, wherein the compressed data is encoded into a wavelet-based format.

17. The method as recited in claim 16, wherein at least one transform operation associated with the encoding is carried out in analog.

18. The method as recited in claim 15, wherein the single module represents an imager.

19. The method as recited in claim 15, wherein the data represents an image.

20. The method as recited in claim 15, wherein the data represents video.

21. The method as recited in claim 15, wherein the data includes video.

* * * * *